(12) United States Patent
Konrad (10) Patent No.: US 8,024,632 B1
(45) Date of Patent: Sep. 20, 2011

(54) METHOD AND MECHANISM FOR IMPLEMENTATION-INDEPENDENT, ON-LINE, END-TO-END DETECTION OF FAULTS IN SELF-CHECKING QUEUES IN DIGITAL HARDWARE SYSTEMS

(76) Inventor: Victor Konrad, Sunnyvale, CA (US)

( * ) Notice: Subject to any disclaimer, the term of this patent is extended or adjusted under 35 U.S.C. 154(b) by 923 days.

(21) Appl. No.: 12/008,429

(22) Filed: Jan. 11, 2008

(51) Int. Cl.
*G01R 31/28* (2006.01)
(52) U.S. Cl. .......................................... 714/733; 714/21
(58) Field of Classification Search .................. 365/201, 365/219; 711/159; 710/52, 29; 714/15, 714/819, 733, 21
See application file for complete search history.

(56) References Cited

U.S. PATENT DOCUMENTS

| | | | | |
|---|---|---|---|---|
| 5,299,209 A | * | 3/1994 | Murayama et al. | 714/819 |
| 5,404,332 A | * | 4/1995 | Sato et al. | 365/201 |
| 5,426,756 A | * | 6/1995 | Shyi et al. | 711/159 |
| 5,500,864 A | | 3/1996 | Gonia et al. | 714/807 |
| 5,706,443 A | * | 1/1998 | Brady et al. | 710/52 |
| 5,838,895 A | * | 11/1998 | Kim et al. | 714/15 |
| 6,172,927 B1 | * | 1/2001 | Taylor | 365/219 |
| 6,314,478 B1 | * | 11/2001 | Etcheverry | 710/29 |
| 6,538,467 B2 | | 3/2003 | Bentz | 326/38 |

* cited by examiner

*Primary Examiner* — David Ton
(74) *Attorney, Agent, or Firm* — Deborah W. Wenocur (57) ABSTRACT

A method and apparatus are provided for detecting faults in a queue (also known as FIFO) in a digital system. The method augments the FIFO with an external monitoring mechanism which, on demand, checks the FIFO's operation and alerts the system to malfunctioning of the FIFO's control mechanism or corruption of data contained therein. The detection apparatus does not depend on the implementation of the FIFO; the checking is based solely on observing the data entering and exiting the FIFO. Furthermore, the apparatus works in a non-intrusive manner during a normal operation of the FIFO as part of the system. The method and apparatus allow for many variants, all derived from the same general scheme, and which allow different levels of protection against faults.

16 Claims, 3 Drawing Sheets

Block diagram of the FIFO monitor

Figure 1: Block diagram of the FIFO monitor

METHOD AND MECHANISM FOR IMPLEMENTATION-INDEPENDENT, ON-LINE, END-TO-END DETECTION OF FAULTS IN SELF-CHECKING QUEUES IN DIGITAL HARDWARE SYSTEMS

FIELD OF THE INVENTION

The present invention relates generally to enhancing the reliability of digital hardware systems and, more specifically to the detection of faults, of transitory or permanent nature, in queues (FIFOs), which are ubiquitous components of digital hardware systems.

BACKGROUND OF THE INVENTION

Detection of faults is important in ensuring the reliability of digital hardware systems. Various types of faults can manifest themselves in the finished product; they may be due to errors in design, manufacturing, wear and tear, or one-time events which do not affect the behavior of the system permanently (the so-called "soft errors"). Cognizant of the possibility of faults, system designers devise schemes to monitor the system for correct operation and alert it to the presence of possible faults.

Because of the size and complexity of digital hardware systems today, it is often impossible or impractical to monitor the system as a whole. Rather, the system designers create schemes to monitor individual modules of the overall system. Because these modules vary greatly in function, the mechanisms which monitor the faults in such modules naturally vary as well. For example, communication channels or storage modules (memories, disks etc.) can be monitored for faults using redundancy-based schemes, and computational units such as ALUs (arithmetical-logical units) can be monitored using the modulo-3 arithmetic etc. When very high reliability is desired, it is of course possible to duplicate the entire module and to compare the results of the function of the duplicates, but this solution is usually too expensive. While no mechanism can discover all possible faults, various schemes exist to discover large classes of faults, and it is a general rule that the monitoring system grows in complexity as its capability to discover faults grows (the duplication scheme being an extreme example). Other cases that exemplify the increase of fault coverage at the expense of growing complexity are the so-called Hamming (n,m) codes, in which a binary m-vector is multiplied by an n×m matrix; and as is well known to those skilled in the art of error-correcting codes, the ability to detect (and correct) failures grows with the size of the matrix. Error-correcting and error-correcting codes are described in The *Theory of Error-Correcting Codes, by F. J. McWilliams and N. J. A. Sloane, North-Holland Mathematical Library,* 1977.

The current invention pertains to the detection of faults in queues, or FIFOs. FIFOs are ubiquitous in modern digital hardware systems and fulfill a variety of functions. They are typically used as synchronizing interfaces between modules which do not operate at the same rate. As such, they are particularly prevalent in SoC ("systems on a chip") designs, in which large collection of heterogeneous hardware modules are "glued" together by the system's integrators to provide the final integrated circuits. These modules, which typically originate from different suppliers, often work asynchronously, which means that a module producing data may do so at a rate that is higher than the ability of another module to consume it, and so a holding buffer must be interposed between the two modules; and, if the consuming module needs the data in the order in which it was generated by the producer, the buffer must be of a FIFO type. Specialized versions of FIFOs, such as pipelines, are the mainstay of modern central processing units of microprocessors. The implementation of FIFOs also varies very widely, ranging from fully static (in which the data, once inserted into the FIFO, never moves) to fully dynamic (where the data circulates through the system upon every insertion and deletion) and many other variants.

SUMMARY OF THE INVENTION

The present invention provides a mechanism and apparatus for a fault detector in FIFOs which has the following desirable characteristics:

1. It is an external addition to the FIFO mechanism, and does not require any adaptation of the FIFO mechanism proper. This makes it easy to change the design of the internals of the FIFO, or the internals of the designs of the fault detector, without such changes affecting each other.
2. It is a "black box" or "end-to-end", device, i.e. it observes only the inputs and outputs of the FIFO and none of its internal signals,
3. It does not make any assumptions about the algorithm, implementation or internal structure of the FIFO. As mentioned above, there are many radically different ways of implementing FIFOs, and the fault detector described in this invention is applicable to all implementations.
4. It is considerably simpler that the FIFO itself in its complexity. If cost (in terms of the number of components, silicon area, power consumption etc.) were of no consequence, once could (as is sometimes done) achieve a very high level of fault detection by fully duplicating the FIFO and comparing the output of both duplicates. The present invention avoids the cost of a full duplication while providing a high level of fault detection.
5. It is capable of operation on-line, i.e. without disrupting the normal operation of the overall system of which the FIFO is part (unless, of course a fault is detected, in which case the system needs to be alerted in order to take corrective action). This is in contradistinction to the so-called BIST (built-in self test) in which, in order to test the integrity of the system, the normal operation of the system is interrupted and the system enters a special test mode.
6. It is possible for an automated CAD tool to insert such a fault detector into the overall system without much disruption, because it is self-contained and does not depend on the environment in which the FIFO operates. In other words, it is possible to retrofit an existing system by an automated CAD tool that can add such a fault detector to an existing FIFO.
7. It provides good fault coverage, i.e. it is capable of detecting many faults, both permanent (e.g. stemming from design or production defects) and transitory ("soft errors"). In particular, it is capable to detect faults, not only in the data content itself (which could be accomplished, albeit with a higher cost, by adding parity bits or other redundant information to each data item entering the FIFO and checking it upon exit) but also in the control mechanism of the FIFO, which could cause the loss of certain data item, or erroneously interchanging their order, (which would be undetectable using conventional redundancy-based checks).

The fault detection capability is scalable, in that the invention herein describes many variants which can provide better fault detection capability at the cost of some additional complexity of the detector.

DETAILED DESCRIPTION OF THE INVENTION

Aspects of the Invention

Monitoring a data container for corruption of its content or of its access mechanism can be accomplished by computing a certain characteristic quantity of the contents of the container. Such a characteristic quantity could be the count of items in the container, the parity of the bits contained therein, and many other characteristics typically used in error detection. This quantity is hereinafter referred to as "the aggregate quantity" because it characterizes the aggregate of all data items presently contained within the FIFOs.

A first aspect of the invention is that such characteristic quantities can be maintained in an incremental fashion, namely, by updating the said quantity only when an item is added to the container or is removed from it, and without accessing the items inside the container at the moment of computation. Such an incremental mode of computation is hereinafter referred to as "rolling computation". Then, upon request, one could scan all the elements in the container, and while doing so, recalculate the quantity in question, and ascertain that the quantity thus computed is equal to the result of the aforementioned incremental computation. A discrepancy would indicate a corruption in the data or in the access mechanism of the container. This is the principle of the scan chain design, widely utilized in digital systems. Such an approach requires interrupting the normal flow of the system in order to scan the internals of the container.

A second aspect of the invention is that, if the container is a queue, the scanning need not interfere with the normal operation of the queue, because all data elements that are contained within the queue are in due course "flushed out" and can be observed outside of the container.

Definition of Terms

A queue, or FIFO, is a container for data items which, for the purpose of this description, are bit strings, each consisting of a fixed number L of bits. The maximum number of data items that a FIFO can hold, known as its depth, is denoted by D. The container performs two operations: "enqueuing", which means inserting a data item into the FIFO, and "dequeueing", meaning the removal of a data item from a queue. Enqueue and dequeue operations can occur in any order (subject to the constraint that no dequeue happens when the FIFO is empty and no enqueue happens when the FIFO is full). For simplicity, this description of the invention assumes that, at any given moment, only one operation (an enqueue or dequeue) may occur, though this simplifying assumption is made for purposes of clarity only and one skilled in the art will easily be able to see that the concepts generalize to simultaneous enqueue/dequeue operations. The fundamental property which a FIFO must satisfy is that data elements are dequeued in the same order in which they were enqueued. It is also required that each dequeued data element emerges from the FIFO unchanged.

At any given point in time, we can speak of the content of the FIFO, which is the aggregate of all data items contained therein. For example, although the depth, or capacity, of the FIFO is a positive number D, typically at the beginning of operation the FIFO will be empty. After e enqueue operations and d dequeue operations the FIFO will contain (e-d) valid data items, which are collectively defined as the FIFO's content.

Figure 1:
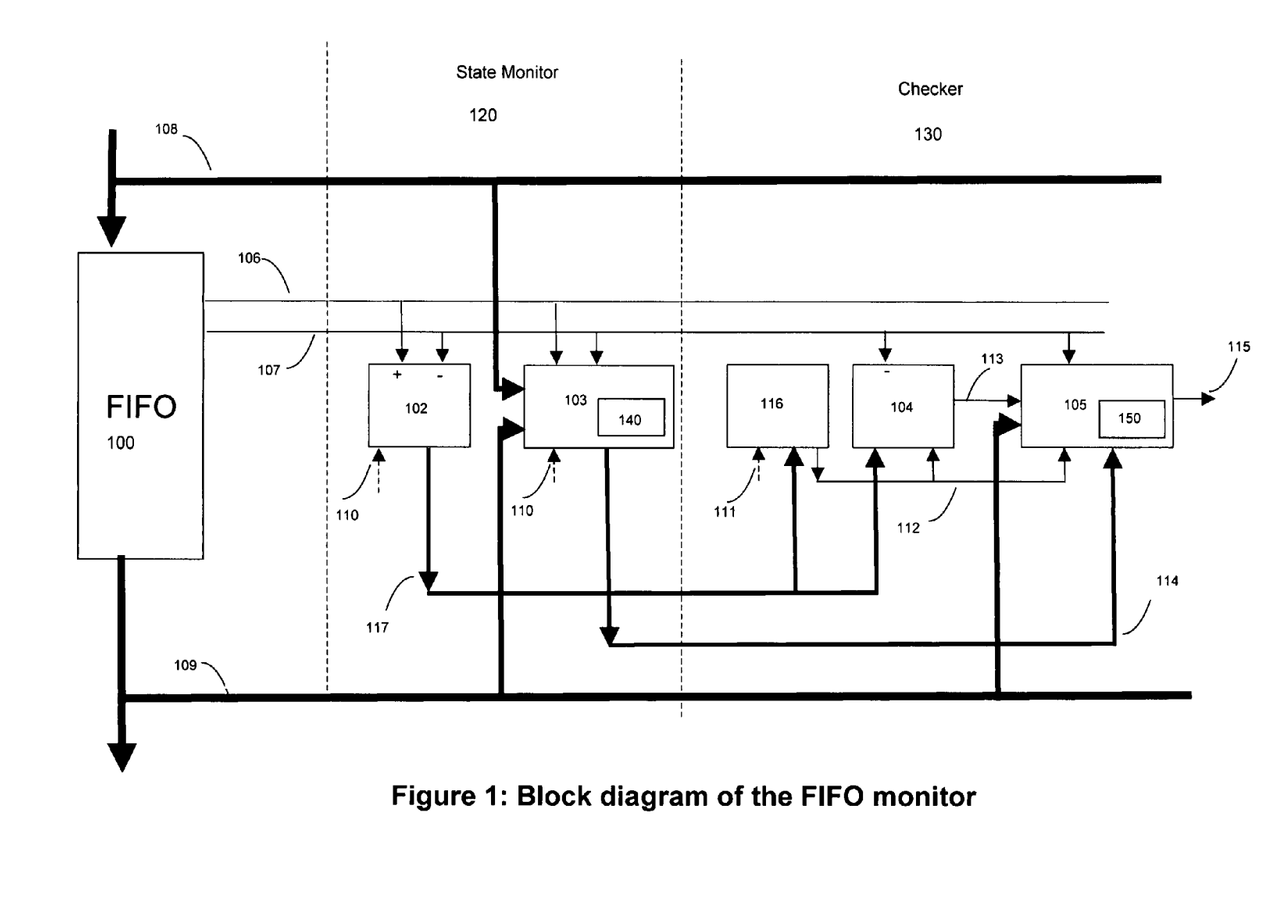
FIG. 1 depicts the block diagram and data flow of a system comprised of a FIFO and the fault detector
Figure 2:
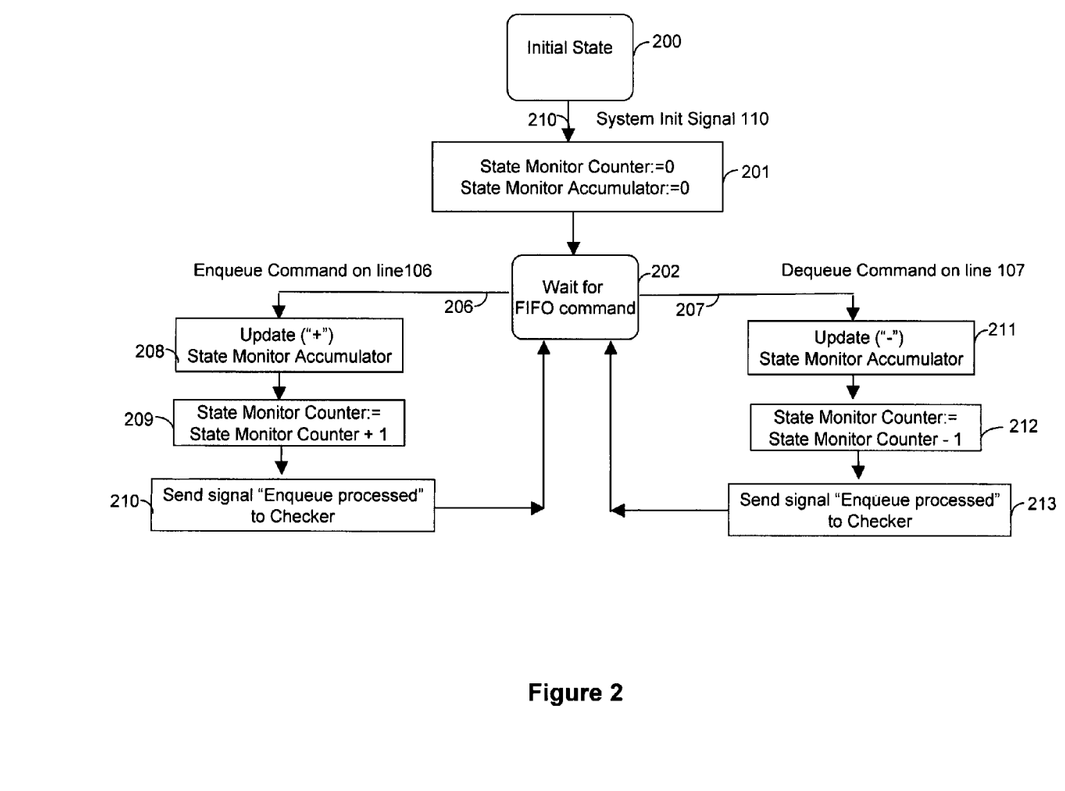
FIG. 2 is a flow chart depicting the control flow of the state monitor.
Figure 3:
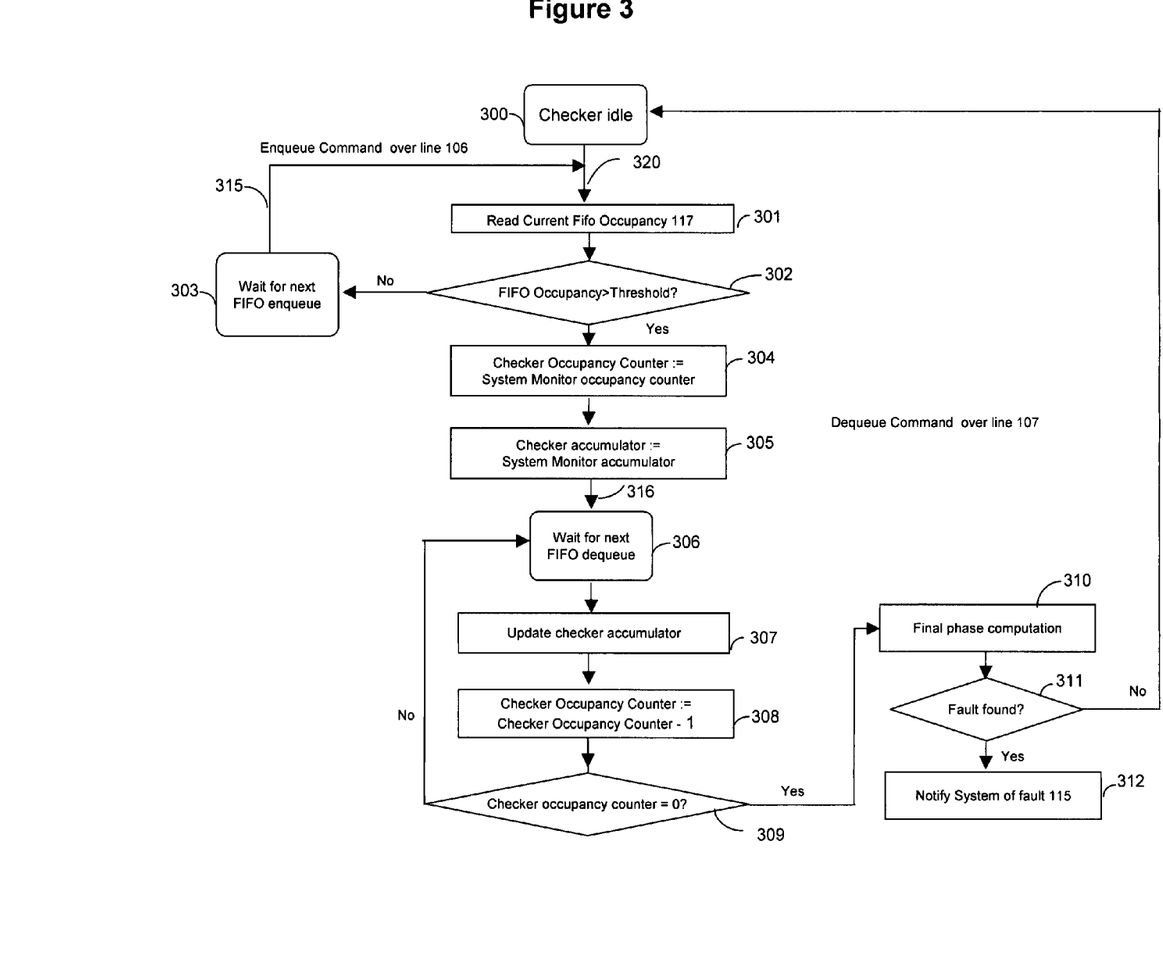
FIG. 3 is a flow chart depicting the control flow of the checker, using the same notation as FIG. 2.

The inventive fault detector apparatus consists of two interconnected computing modules, hereinafter referred to as "State Monitor" and "Checker" respectively. The structure of the fault detector, the interconnections among the units and the connections of the fault detector to the FIFO proper are illustrated in FIG. 1. The control flow of the state monitor is illustrated in FIG. 2, and the control flow of the checker is illustrated in FIG. 3.

FIG. 1 depicts the block diagram and data flow of a system comprised of a FIFO 100 (depicted as a "black box") and the fault detector. The fault detector is comprised of two main assemblages, the State Monitor 120 and the Checker 130, and each of these assemblages is itself comprised of various sub-modules.

The State Monitor 120 is composed of the Sub-modules State Monitor Occupancy Counter 102 and the State Monitor. Accumulation Automaton 103. The State Monitor Accumulation Automaton 103 contains within it a buffer, called the State Monitor Accumulator 140.

The Checker assemblage 130 consists of the blocks Checker Starter 116, the Checker Occupancy Counter 104 and the Checker Accumulation Automaton 105. The Checker Accumulation Automaton 105 contains within it a buffer, called the State Monitor Accumulator 150.

The Enqueued Data Bus line 108 and Dequeued Data Bus Line 109 carry the data items entering and leaving the FIFO to the various sub-modules of the fault detector. The Current FIFO Occupancy Data Bus 117 and the Checker Accumulator Initialization Data Bus 114 carry data between the State Monitor 120 and the Checker 130. The Enqueue Command line 106 and the Dequeue Command line 107 carry signals from the FIFO to the fault detector indicating, respectively, the completion of an enqueue and a dequeue operation. The State Monitor Init Command Line 110 carries an initialization command signal from the external system to the sub-modules of the State Monitor 120. The Start Check Command line 111 carries a command from the external system to the Checker Starter 116 to prepare for the checking action. The Checker Starter 116 uses the Checker Ready Command Line 112 to notify the Checker Occupancy Counter 104 and the Checker Accumulation Automaton 105 to commence the checking action proper. End of Check Line 113 is used by the Checker Occupancy Counter 104 to send a signal to Checker Accumulation Automaton 105 indicating the end of the check. Finally, the line Fault 115 is used by the fault detector to indicate the finding of a fault during a checking operation.

The Detailed Structure and Operation of the State Monitor

The State Monitor Occupancy Counter 102 continuously computes the count of elements in the FIFO. This counter is initialized to zero at startup time by the signal State Monitor Init Command 110. The occupancy counter then waits idly until it receives an enqueue or a dequeue command signal from the FIFO. Every time an enqueue signal is received on the Enqueue Command Line 106, the counter is incremented; and whenever a dequeue signal is received on the Dequeue Command Line 107, the counter is decremented.

The purpose of the State Monitor Accumulation Automaton 103 is to continuously compute and maintain a certain state quantity S (also referred to as an aggregate quantity), stored in the State Monitor Accumulator 140. This quantity S is an additive, or cumulative, function, of all the elements currently contained within the FIFO, and which reflects an aggregate property of all these elements. (One example of such a property can be the parity of all bits of all the data elements within the FIFO). The accumulation automaton updates the value of the State Monitor Accumulator 140 each time an enqueue or dequeue occurs, based only on the previous value stored in this accumulator and the quantity presently being enqueued or dequeued, without accessing the data items within the FIFO (and thus preserving the "black box" aspect of the fault detector). Loosely speaking, the State Monitor Accumulation Automaton 103 is a generalization, or abstraction, of an adder/subtractor: when an enqueue operation occurs, the accumulation automaton "adds" something to the quantity stored in the accumulator, whereas the "dequeue" operation "subtracts" something from it (the exact nature of these generalized additions/subtractions depending on the chosen fault detection scheme)

FIG. 2 illustrates the flow of control of the State Monitor 120, depicting its wait states (ovals) transitions (arrows) and actions (blocks) as follows:

Block 200 indicates the initial idle state of the State Monitor 120 prior to start.

Transition 210 is taken when the external system sends the State Monitor Init Command over line 110 (see FIG. 1)

Block 201 indicates the initialization action taken in response to Transition 210, in which the State Monitor Occupancy Counter 102 is set to 0 and the State Monitor Accumulation Automaton 103 initializes the State Monitor Accumulator 140 to zero.

Block 202 depicts the idle state of the State Monitor 120 awaiting a FIFO command.

Transition 206 depicts the arrival of an Enqueue Command over line 106

In Block 208, State Monitor Accumulation Automaton 120 updates (using the "generalized addition" or "+" operation) the quantity S contained within the State Monitor Accumulator 140.

Block 209 increments the State Monitor Occupancy Counter 102;

Block 210 sets a flag for the checker indicating that the processing of the enqueue command by the State Monitor is completed.

Transition 207 depicts the arrival of a Dequeue Command on line 107

In Block 211, State Monitor Accumulation Automaton 120 updates (using the "generalized subtraction" or "−" operation) the quantity S contained within the State Monitor accumulator 140.

Block 212 decrements of the State Monitor Occupancy Counter 102

Block 213 sets a flag for the checker indicating that the processing of the dequeue command by the State Monitor is completed.

The Detailed Structure and Operation of the Checker

The Checker 130 contains certain sub-modules that are similar to those contained within the State Monitor 120. It contains the Checker Occupancy Counter 104, and the Checker Accumulation Automaton 105, which in turn contains the buffer Checker Accumulator 150. These sub-modules differ from their State Monitor 120 counterparts in that the Checker Occupancy Counter is only a down-counter which counts down only on dequeue operations; and likewise, Checker Accumulation Automaton 105 responds only to dequeue operations. In other words, the Checker Accumulator, like the State Monitor Accumulator, continuously computes and maintains state quantity S (also referred to as the aggregate quantity), an additive, or cumulative, function, of all the elements currently contained within the FIFO, and which reflects an aggregate property of all these elements. A major difference between the State Monitor 120 and the Checker 130 is that the Checker 130 is not active at all times. Therefore an additional unit, the Checker Starter 116 is provided which determines the starting time of the actual checking operation. The Checker Starter 116 is initially activated by a system signal Start Check Command Line 111 and enters the "warm-up phase" in which it waits for the FIFO to reach a certain level of occupancy. Once that level is reached, the Checker Starter 116 issues an activation signal on the Checker Ready Command Line 112 to the Checker Occupancy Counter 104 and to the Checker Accumulation Automaton 105. At that point in time, the checker enters its initialization phase. Henceforth, the checking action is ongoing as follows. Upon each dequeue operation, the Checker Occupancy Counter 104 is decremented and the Checker Accumulation Automaton 105 updates its value of the Checker Accumulator 150. Note that the Checker 130 disregards all enqueue signals. When the content of the Checker Occupancy Counter 104 reaches zero, the Checker Accumulation Automaton 105 reaches the final phase of the check, in which it determines whether a fault has been detected.

The following is a more detailed description of the operation of the checker, referring to flowchart of FIG. 3. The notational symbols are the same as in FIG. 2.

Block 300 indicates that the Checker is idle, waiting for a start command

Transition 320 is taken upon receiving the signal "Start check Command" from the external system on Start Check Command Line 111. This transition marks the beginning of the aforementioned "warm-up" phase.

In Block 301, the Checker Starter 116 reads the current content of the State Monitor Occupancy Counter 102 over line 117

In Block 302, the Checker Starter 116 compares that value to a certain threshold. If the threshold is exceeded, ("Yes" action) the transition to Block 304 is taken, which encapsulates the initialization of the checker. In the case the threshold is not exceeded ("No" action), the Checker Starter 116 moves to the wait state 303 as explained below.

Block 303 is the idle (wait) state to which the Checker Starter 116 transitions if the threshold has not been exceeded. In essence, the checker is waiting until the FIFO fills up to a certain level given by the threshold. Therefore, it awaits an enqueue signal, which indicates to it that the occupancy of the FIFO has increased.

Transition 315 is taken upon receiving an Enqueue signal from the FIFO over line 106

Block 304 is reached when the level of occupancy of the FIFO exceeds the prescribed threshold. At this point, the Checker Occupancy Counter 104 is initialized to the value of the initialization of the State Monitor Occupancy Counter 102, using line 117.

Block 305 is the second part of the initialization of the Checker. This block describes the action of copying the current content of the State Monitor Accumulator 140 into the Checker Accumulator 150 over line 117. The current content of the State Monitor Accumulator at the start of the checking process is called the "checkstart state quantity". The checkstart state quantity, along with the initialized content of State Monitor Occupancy Counter 102 (i.e. the initialized count of elements in the queue at the start of the checking process) is hereinafter referred to as the "check-start content", because it serves as a starting state for the checking operation.

Block 306 is a wait state in which the Checker awaits a dequeue signal. (As mentioned above, the checker disregards the Enqueue signals during it normal operation).

Transition 316 is taken when a Dequeue command is issued over line 107.

In Block 307, the Checker Accumulation Automaton 105 updates (using the "generalized subtraction" or "−" operation) the quantity S contained within the Checker Accumulator 150.

In Block 308, the value of the Checker Occupancy Counter 104 is decremented.

In Block 309, a test is performed to see if the value of the Occupancy Counter 104 reached zero. If not, the control loops back to idle state 306 to await the next dequeue Block 310 indicates the final computation, which is reached when the value of the Occupancy Counter 104 reaches zero. In this computation, the value of the accumulator is examined for a fault indication as appropriate.

Block 311 is a decision block to determine the presence of a fault

In Block 312, a fault notification is sent to the external system

General Description of Different Variants of the Invention

The structural diagram of FIG. 1 and the control behavior shown in FIGS. 2 and 3 encompasses an entire family of variants of the invention, each of which corresponds to an embodiment of the invention. All members of the family share that structure and that behavior, but differ in the algorithm they implement. Members of the family differ in the in the internal structure and the behavior of the State Monitor Accumulation Automaton 103 and the Checker Accumulation Automaton 105. Behaviorally, they differ from each other in the behavior encapsulated in Boxes 203 and 206 of FIG. 2, and boxes 307 and 310 of FIG. 3.

The different variants of the invention correspond to different choices of the cumulative quantity S which is continuously computed by the State Monitor Accumulation Automaton 103 and the Checker Accumulation Automaton 105. They correspond, in most cases, to quantities that are typically used in the art of error detection codes. Such quantities include, but are not limited to, linear codes, cyclical redundancy codes, checksums etc. Each of these choices provides a different level of fault coverage.

The detailed description of some variants of the family follows below. It is important to realize that a particular design of a fault checker may consist of one of these variants only, or utilize a combination of two or more different variants to increase fault coverage. In the latter case, all of the State Monitor elements except for the Monitor Accumulation Automaton 103, and all of the elements of the Checker except for the Checker Accumulation Automaton 105 can be shared and need not be duplicated.

Variant 1: Fault Detection in the Control Mechanism of the FIFO

The fundamental property of the queue is the FIFO (first-in-first-out) property, which states that the items are dequeued in the same order as they were enqueued. It can be easily by one skilled in the art that this property is equivalent to the following: if at a certain moment a particular element E is enqueued, and immediately after this enqueue operation there are N elements inside the FIFO, then the element E will emerge from the FIFO on the N'th dequeue operation afterwards (irrespective of the number of enqueue operations that happen in the interim). In order to check this property, the enqueued element E is captured (in the Checker Accumulator 150) and, after N dequeue operations have occurred, the last dequeued element is compared with E. A discrepancy between these values is a powerful indicator of a fault, most likely in the control of the FIFO which caused it to erroneously insert or delete entries from the FIFO's buffers, or possibly shuffle entries within the buffer in such a way that E emerged at the wrong time. The discrepancy could also discover the corruption of data itself, but this detection is limited only to corruption of the entry E itself.

This mode of fault checking can be realized by the general blueprint provided by FIGS. 1, 2 and 3, as follows:

Box 208: the State Monitor Accumulation Automaton 103 update action consists of storing the most recently enqueued element in the State Monitor Accumulator 140

Box 211: No operation is performed

Box 307: No operation is performed

Box 310: The final computation consists of comparing the content of the Checker Accumulator 150 with the most recently dequeued data entry. A discrepancy indicates a fault.

The Sub-Family of Fault Detectors Based on Redundancy Bits

Corruption of data is often detected using redundancy checks, which have their origin in digital communication. A transmitter is tasked with conveying certain data over to a receiver side. To alert the receiver to the possible presence of fault, the transmitter computes, from the data it is about to transmit, a certain quantity S. This quantity is then stored in redundant bits, which are also known as guard bits, and which are appended to (or interspersed among) the actual data bits and transmitted along with them. (The redundant bits do not convey any additional information and serve only as a fault-detection device, hence their name). On the receiving side, the receiver computes the same quantity using the received data and compares the result of its calculation with the transmitted guard bits. If there is a discrepancy between the quantity S as computed by the receiver and the quantity contained in the received guard bits, this indicates a presence of a transmission fault (or multiple faults).

The current invention adapts this general scheme to fault detection in the data stored within a FIFO. An enqueue/dequeue operation (or a series of such operations) can be regarded as analogous to transmission/reception. The state monitor continuously maintains the value of the guard bits for the entire content of the data in the FIFO. When the checking operation starts, a snapshot of the guard bits is conveyed to the checker and held in the checker's accumulator. Henceforth, upon each dequeue operation, the checker computes the quantity S of the dequeued element and "subtracts" it from the value stored in the accumulator After a certain number of dequeue operations, the entire content of the FIFO (at the time the snapshot was taken) is "swept out" and the resulting computation of the checker should yield a result of zero in the accumulator of the checker: any other result indicates the presence of a fault.

For such a scheme to work, it is necessary that the quantity S (which at all times reflects the state of the entire content of the FIFO) be computable in a piecemeal fashion. Upon an enqueue operation, the updating operation (generalized addition) must correctly update S based only on its previous value (as stored in the guard bits) and the current data item being enqueued, without directly accessing all the elements that are inside the FIFO. Analogously, an operation updating S upon a dequeueing operation (the generalized subtraction) must re-compute S based only on its previous value and the data item being dequeued.

Many well-known schemes of fault detection based on redundancy are indeed of this nature. These are the schemes based on the so-called linear codes, in which the guard bits are computed by multiplying the binary vector V of all data bits which form the current content of the FIFO by a binary matrix M, with all operations being modulo 2. The vector has length N=L*C, where L is the length of the data item in bits and C is the number of data items present inside the FIFO when the snapshot is taken. The matrix is of dimension N*m, where m is the number of the guard bits. It can easily be seen that this computation can be computed piecemeal by performing the M*V multiplication in a block fashion. The matrix M is subdivided into C matrices (vertical slices of M) of dimension L*m each, and the vector V is subdivided into C slices of length L. Each enqueue/dequeue operation corresponds to multiplying a slice of the matrix by the corresponding slice of the vector, and the partial result (which is m bits long) is added into the accumulation buffer, which is m bit long.

Variant 2 (a Sub-Case of Linear Codes): A Fault Detector Based on a Single Parity Bit The simplest widely used redundancy scheme for fault checking is the parity scheme. In this case, S is simply a single bit quantity computed by performing an exclusive-OR operation on all bits of the data. This scheme is based on a linear code in which m equals 1, and the matrix M has only one row, all whose elements are equal to 1. This scheme provides the capability to detect the occurrence of fault that corrupts (i.e. changes the value of) an odd number of bits.

The present invention is suited for the implementation of the scheme, because parity is an additive quantity. The quantity S being maintained by the State Monitor Accumulator 103 is simply the parity, or the cumulative exclusive-OR, of all the bits present inside the FIFO. The accumulator of the State Monitor Accumulation Automaton 103, as well as the accumulator of the Checker Accumulation Automaton, is comprised of a single bit. Upon each enqueue, the accumulation automaton of the state monitor computes the parity of the data item being enqueued and adds the result (in the exclusive-OR sense) to the content of its accumulator. Upon each dequeue, the accumulation automaton of the state monitor computes the parity bit of the dequeued data item and subtracts it (again in the exclusive-OR sense) from the state monitor's accumulator. (Note that the subtraction and addition in the exclusive OR operation are exactly the same). The accumulator of the Checker Accumulation Automatorr 105, when the checking operation begins, is initialized to hold the parity of the entire content of the FIFO. When the checking is in progress, the Checker Accumulation Automaton 105 works exactly in the same way as the State Monitor Accumulation Automaton 103, responding to dequeue commands only.

When the checking phase is completed, and the content of the accumulator is non-zero, this indicates a fault.

This mode of fault checking can be realized by the general blueprint provided by FIGS. 1, 2 and 3, as follows:

Box 208: The State Monitor Accumulation Automaton 103 update action consists of computing the parity of the enqueued data item and adding this parity (in the modulo-2 sense) to the contents of the State Monitor Accumulator 140.

Box 211: The State Monitor Accumulation Automaton 103 update action consists of computing the parity of the dequeued data item and subtracting this parity (in the modulo-2 sense) from the contents of the State Monitor Accumulator 140. (Note that subtraction and addition are the same in modulo-2 arithmetic)

Box 307: The Checker Accumulation Automaton 105 update action consists of computing the parity of the dequeued data item and subtracting this parity (in the modulo-2 sense) from the contents of the Checker Accumulator 150. (Note that subtraction and addition are the same in modulo-2 arithmetic).

Box 310: The final computation consists of checking whether the content of the Checker Accumulator 150 equals zero. A result of 1 indicates a fault.

Variant 3: Detection of Data Corruption within the FIFO Using Multiple Parity Bits A stronger protection than that provided a single parity bit is afforded by a multiple parity bits. In this scheme there are k parity bits, each of which protects a certain subset of the bits of the data element. For instance, if each data element consists of L=p+q bits, one could employ a two-bit parity scheme (i.e. k=2), where one parity bit protects the most significant p bits of each data item and the other parity bit protects the q least-significant bits by another bit q. This scheme generalizes in an obvious fashion to any number k of parity bits, where each bit monitors a certain subset of the (not necessarily consecutive) bits comprising each data elements. These subsets need not be mutually exclusive, but have to cover the entire set of bits. The multiple-bit parity scheme, as is well known to anyone skilled in the art, is more powerful than the single bit parity scheme, because it can also flag certain failures due to an odd number of corrupted bits. This scheme encompasses the so-called Hamming codes, well known in the art of error-correction codes, and which are known to detect multiple faults.

This fault checking scheme can be readily adapted by a generalization of the fault monitor of a single-bit parity fault checker described above. In this case, the single-bit accumulators and the holding buffer are replaced by k-bit vectors, and the accumulation automata perform bitwise XOR operations on the respective bits of the buffers. The correctness of this scheme follows from an analogous argument to that set forth in Variant 1. Depending on the particular code chosen, this scheme will can detect multiple faults if they occur within a single data item, as well as many other multiple-error scenarios.

Variant 4: Fault Detection Based on Checksum

Another method of fault detection which is widespread in digital communication is based on checksums. Given a string of N bits, and a small integer k such that k divides N evenly, the transmitter divides the string into N/k groups of bits, with each group consisting of consecutive k bits. Each such group is then treated as a k-bit integer and the transmitter adds them together using normal binary addition using 2's complement arithmetic. The resulting sum constitutes the guard bits which are appended to the message. On the receiving end, the receiver performs the same exact operation and compares the result of its computation to the guard bits as received from the transmitter.

This method has the advantage of guaranteeing, among other faults, the detection of a run of k consecutive bits among which there are corruptions.

The general mechanism of the state monitor and the checker can be adapted so that it implements the checksum algorithm. Each data item is treated as an L-bit integer, and the accumulation operations for enqueue/dequeue operation is binary addition/subtraction in 2's complement arithmetic. The accumulators are of length~$L+\log_2(D)$ and the accumulation automata are adders/subtractors using 2's complement arithmetic. (The additional $\log_2(D)$ bits are provided to ensure that no overflow occurs during the addition/subtraction operations).

This mode of fault checking can be realized by the general blueprint provided by FIGS. 1, 2 and 3, as follows:

Box 203: the State Monitor Accumulation Automaton 103 update action consists of adding the incoming data item (treated as an L-bit integer) to the contents of the State Monitor Accumulator 140.

Box 206: the State Monitor Accumulation Automaton 103 update action consists of treating the dequeued data item as an L-bit integer and subtracting its value (in the sense of 2's complement arithmetic)) from the contents of the State Monitor Accumulator 140

Box 307: Same as Box 206

Box 310: The final computation consists of checking whether the content of the Checker Accumulator 150 equals zero. A nonzero result indicates a fault.

Variant 5: Cyclical-Redundancy Check

Cyclical redundancy checks (CRC) are a well-known and powerful method for fault detection. Given a vector V of N=L*C bits, one regards this vector as a polynomial P(x) of degree N−1 with binary coefficients. One then divides the polynomial by a fixed polynomial d(x) of degree m, and the residue from the division r(x) is a polynomial of degree m−1 (at most) whose m coefficients are the guard bits.

This operation can be expressed as $$P(x)=q(x)*d(x)+r(x)$$

(All computations are done modulo 2.)

The art of the design and implementation of cyclical-redundancy checks provides a wide choice of polynomials for various uses, as well as efficient means of implementing the abovementioned polynomial division in hardware.

The general fault detection mechanism can be adapted to perform this computation in a piecemeal fashion. The quantity S being maintained by the state monitor is the polynomial P(x) mod d(x), where P corresponds to the string of bits formed by the concatenation of all data elements inside the FIFO. At each enqueue operation, the state monitor receives an input which can be regarded as a polynomial $P_i(x)$ of degree L−1 whose coefficient are the bits of the enqueued data item. Therefore, k consecutive enqueue operations will load the FIFO with the bit string whose polynomial representation is $$P_k(x)=P_0(x)+x^L P_1(x)+x^{2L}P_2(x)+\ldots+x^{(k-1)L}P_{k-1}(x)$$

Hence, by the rules of polynomial modular division $$P_k(x) \bmod d(x) = P_0(x) \bmod d(x) + x^L P_1(x) \bmod d(x) +$$
$$x^{2L}P_2(x) \bmod d(x)+\ldots+x^{(k-1)L}P_{k-1}(x) \bmod d(x)$$
$$= P_0(x) \bmod d(x) + [x^L \bmod d(x)]*[P_1(x) \bmod d(x)] +$$
$$[x^{2L} \bmod d(x)]*[P_2(x) \bmod d(x)]+\ldots+[x^{(k-1)L}$$
$$\bmod d(x)]*[P_{k-1}(x) \bmod d(x)]$$

Therefore the accumulator automaton of the state monitor, when it receives the i'th element of data to be enqueued, forms the polynomial $P_i(x) \bmod d(x)+x^{iL} \bmod d(x)$, and accumulates it in the State Monitor Accumulator 140 using polynomial (coefficient-wise) addition modulo 2. This expression is readily evaluated by computing $x^{iL} \bmod d(x)$ recursively. The dequeue operations work similarly, and it is evident that, after q enqueue operations and p dequeue operations (where p is less or equal to q) the quantity S representing the content of the FIFO (i.e. the concatenation of q-p data items contained within it) equals $$S=[x^{pL} \bmod d(x)]*[P_p(x) \bmod d(x)]+[x^{(p+1)L} \bmod d(x)]$$
$$*[P_{p+1}(x) \bmod d(x)]+\ldots+[x^{(q-1)L} \bmod d(x)]*$$
$$[P_{q-1}(x) \bmod d(x)]$$

Assuming that the fault detection commences at that point in time, the quantity S is stored in the Checker Accumulator 150. The Checker Accumulation Automaton, given the initial value of p, will then compute, upon each dequeue operation, the next consecutive term of the sum above and subtract that term form the Checker Accumulator 150. When the Checker Occupancy Counter 104 reaches zero, the Checker Accumulation Automaton 105 will have effectively subtracted the entire sum from the value initially stored in the Checker Accumulator 150 and therefore the content of the Checker Accumulator 150 should be zero; any other result will be an indication of a fault.

This mode of fault checking can be realized by the general blueprint provided by FIGS. 1, 2 and 3, as follows:

Box 208: the State Monitor Accumulation Automaton 103 update action consists of computing the polynomial $P_i(x) \bmod d(x)+x^{iL} \bmod d(x)$, having computed the value of $x^{iL} \bmod d(x)$ recursively, and adding this polynomial (in the modulo-2 sense addition of polynomials) to the contents of the State Monitor Accumulator 140.

Box 211: the State Monitor Accumulation Automaton 103 update action consists of computing the polynomial $P_i(x) \bmod d(x)+x^{iL} \bmod d(x)$, having computed the value of $x^{iL} \bmod d(x)$ recursively, and subtracting polynomial (in the modulo-2 sense addition of polynomials) to the contents of the State Monitor Accumulator 140

Box 307: the Checker Accumulation Automaton 105 update action consists of computing the polynomial $P_i(x) \bmod d(x)+x^{iL} \bmod d(x)$, having computed the value of $x^{iL} \bmod d(x)$ recursively, and adding subtracting polynomial (in the modulo-2 sense addition of polynomials) to the contents of the Checker Accumulator 140

Box 310: The final computation consists of checking whether the content of the Checker Accumulator 150 equals zero. A result of a nonzero polynomial indicates a fault.

When to Initiate the Detection Process

As described above, the fault detection process is initiated by an external command, which activates the checker: the actual checking process commences upon the first enqueue thereafter, and the process remains in progress until the occupancy counter of the checker reaches zero, whereupon the checker decides if a fault was present and is ready for the next round of monitoring. This leaves open the question at which point, or points, in time should the checking be initiated. This is a decision that the system designer should make based on overall considerations of reliability, power consumption etc. For example, to ensure maximum fault detection capability, a new round of fault checking could be initiated as soon as the previous round has completed. In the case of parity, checksum or CRC monitoring this would mean that the protection is extended over any data item that enters the FIFO at any time. Alternatively, the system designer may decide on less frequent activation of the checker. This will result in less activity and lower power consumption, but the data items which are enqueued and dequeued while the checker is not enabled will not be monitored for faults.

The Choice of the Threshold

As mentioned in the explanation to Boxes 301, 302, and 303 the choice of the threshold determines the minimum occupancy of the FIFO at which the "warm-up phase" ends and the checking operation proper can begin. In other words, the higher the threshold, the less often a checking operation can actually start, because the Checker Starter 116 will remain in the loop consisting of Boxes 301, 302 and 303 until the threshold is exceeded, i.e. the FIFO is filled to the desired extent. This would mean a less frequent, but more thorough checking operation. Thus the choice of the threshold provides an extra degree of freedom to the system designer.

In summary, the invention presented herein is of a digital system whose purpose is to monitor the correctness of the operation of a FIFO for faults. The inventive system observes only the external inputs and outputs of the FIFO, which is otherwise a "black box" to it, and performs a check of correctness on demand, without interrupting the operation of the FIFO. Various methods of error-detection, which include, but are not limited to, a single parity bit, multiple parity bits, linear codes and cyclical redundancy codes, can be implemented by variants of the invention, thus providing different levels of fault coverage.

It is not expected that the invention be restricted to the exact embodiments disclosed herein. Those skilled in the art will recognize that changes and modifications can be made without departing from the inventive concept. As an example, one can realize the function of the Checker Accumulation Automaton by having it add, rather than subtract (as described by Box 307), and then changing the step of Box 310, from comparing the final value of the Checker Accumulator 150 against zero to comparing the value of the Checker Accumulator 150 with a pre-stored value. Other variations which are not explicitly listed above but are encompassed by the invention are adaptations of the general blueprint to other codes which can be computed in an incremental fashion, such as Fletcher's checksum method. Other aggregate quantities computed by a rolling computation than those described herein may be used. The scope of the invention should be construed in view of the claims.

What is claimed is:

1. A digital fault detector system for detecting faults in a digital queue (FIFO), said FIFO having an input and an output and contents, the system comprising:
a state monitor configured to continuously compute a state aggregate quantity characterizing the contents of said FIFO at any given time; said state aggregate quantity being of a specified aggregate quantity type; and
a checker for recalculating said state aggregate quantity beginning at a start check time, to obtain a checker aggregate quantity, said checker aggregate quantity being of said specified aggregate quantity type, for comparison with said state aggregate quantity computed by said state monitor.

2. The system of claim 1, wherein said state monitor is configured to compute said state aggregrate quantity from the input and output of said FIFO, and said checker is configured to compute said checker aggregate quantity from the output only from said FIFO.

3. The system of claim 2, wherein the computing of said state aggregate quantity from the input and output of said FIFO comprises updating a state quantity including a count of elements in said queue each time the content of said queue changes.

4. The system of claim 2, wherein the computing by the checker of said checker aggregate quantity from the output only from said FIFO comprises beginning with a checkstart content including a checkstart state quantity and an initialized count of elements in said queue, and updating said checkstart state quantity each time a dequeue operation occurs, said updating ending when the number of dequeueing operations totals the checkstart quantity initialized count of elements in said queue, said updated checkstart state quantity when the number of dequeueing operations totals the checkstart quantity initialized count of element in said queue being said checker aggregate quantity.

5. The system of claim 4, further configured to compare said checker aggregate quantity characterizing said contents of said FIFO at least one specified time with the corresponding said state aggregate quantity characterizing said contents of said FIFO at said specified time, each said computation of a checker aggregate quantity and comparison with the corresponding state aggregate quantity being a fault checking process.

6. The system of claim 5, further configured to activate the checker by an external command to initiate a said fault checking process.

7. The system of claim 6, configured to initiate a new fault checking process as soon as a previous fault checking process is completed.

8. The system of claim 6, configured to initiate a new fault checking process at selected times.

9. The system of claim 8, wherein said new fault checking process is initiated when the count of elements in said queue exceeds a pre-determined threshold value.

10. The system of claim 1, wherein said specified aggregate quantity is a quantity descriptive of an aggregate of a set of elements, which can be computed by a rolling computation.

11. The system of claim 10, wherein said aggregate quantity is an additive function of said elements in said queue.

12. The system of claim 11, wherein said aggregate quantity is chosen from the group consisting of: single bit parity, multiple bit parity, checksums, Hamming codes, and cyclical redundancy check.

13. A digital fault detector system for detecting faults in a digital queue (FIFO), said FIFO having an input and an output and contents composed of elements, the system comprising:
means for storing the enqueueing value of a first element of said FIFO being enqueued; and
means for determining the dequeueing value of said first element of said FIFO just after said first element is dequeued; and
means for comparing said enqueueing value and said dequeueing value of said first element of said FIFO; a discrepancy between said enqueueing value and said dequeueing value indicating a fault.

14. The system of claim 13, wherein said means for storing the enqueueing value of a first element of said FIFO being enqueued comprises a checker configured to copy a checkstart content comprising the enqueueing value of said first element of said FIFO being enqueued, and the number N of elements inside said FIFO after said first element of said FIFO is enqueued.

15. The system of claim 14, wherein said means for determining the dequeueing value of said first element of said FIFO just after said first element is dequeued comprises said checker configured to determine the value of the last dequeued element following N dequeue operations after said first element is enqueued.

16. The system of claim 15, wherein said means for comparing said enqueueing value and said dequeueing value of said first element of said FIFO comprises said checker configured to compare said value of said last dequeued element following N dequeue operations after said first element is enqueued with said enqueueing value of said first element.

\* \* \* \* \*